United States Patent
Huemiller, Jr

(10) Patent No.: US 7,401,106 B2
(45) Date of Patent: Jul. 15, 2008

(54) MAXIMUM CHANGE DATA PATTERN

(75) Inventor: Louis D. Huemiller, Jr, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 938 days.

(21) Appl. No.: 10/923,122

(22) Filed: Aug. 19, 2004

(65) Prior Publication Data

US 2006/0041790 A1 Feb. 23, 2006

(51) Int. Cl.
G06F 11/263 (2006.01)
(52) U.S. Cl. .................................... 708/200
(58) Field of Classification Search ................ 708/200
See application file for complete search history.

(56) References Cited

U.S. PATENT DOCUMENTS

| 5,313,424 | A | * | 5/1994 | Adams et al. ............... 365/200 |
| 6,026,505 | A | * | 2/2000 | Hedberg et al. ............ 714/711 |
| 6,060,898 | A | * | 5/2000 | Arkin .......................... 324/765 |
| 6,970,798 | B1 | * | 11/2005 | Cao et al. ................... 702/120 |

* cited by examiner

*Primary Examiner*—David H Malzahn

(57) ABSTRACT

In an embodiment of the invention, an apparatus for generating a maximum change data pattern, includes: a shift stage configured to shift a generated signal to the right by one bit and to generate a shifted signal; a logic stage configured to perform an XOR function on the signal and the shifted signal, and generate an XOR output signal; a complement stage configured to complement the XOR output signal, and to generate a complement stage output signal; and a selector configured to select the XOR output signal if the generated signal is even and to select the complement stage output signal if the generated signal is odd.

17 Claims, 2 Drawing Sheets

| (a) Integer Value of Signal 125 | (b) Signal 125 on line 130 | (c) Signal 135 on line 140 (signal 135 is signal 125 that has been shifted right by one bit) | (d) Signal 145 which is XOR of signal 125 and signal 135 | (e) Signal 155, where signal 145 is complemented if signal 125 has an odd integer value |
|---|---|---|---|---|
| 0 | 0000 | 0000 | 0000 | 0000 |
| 1 | 0001 | 0000 | 0001 | 1110 |
| 2 | 0010 | 0001 | 0011 | 0011 |
| 3 | 0011 | 0001 | 0010 | 1101 |
| 4 | 0100 | 0010 | 0110 | 0110 |
| 5 | 0101 | 0010 | 0111 | 1000 |
| 6 | 0110 | 0011 | 0101 | 0101 |
| 7 | 0111 | 0011 | 0100 | 1011 |
| 8 | 1000 | 0100 | 1100 | 1100 |
| 9 | 1001 | 0100 | 1101 | 0010 |
| 10 | 1010 | 0101 | 1111 | 1111 |
| 11 | 1011 | 0101 | 1110 | 0001 |
| 12 | 1100 | 0110 | 1010 | 1010 |
| 13 | 1101 | 0110 | 1011 | 0100 |
| 14 | 1110 | 0111 | 1001 | 1001 |
| 15 | 1111 | 0111 | 1000 | 0111 |

MAXIMUM CHANGE DATA PATTERN

TECHNICAL FIELD

Embodiments of the present invention relate generally to computer systems, and more particularly to a maximum change data pattern.

BACKGROUND

In component testing, a common hardware problem is the skewing of a clock signal that indicates when a value is to be captured. A clock that has too much skew will cause a detected fault if the data on the line is changing. If the clock signal latches at a wrong time as a result of the clock skew, then the clock signal may latch where the data signal does not change and, as a result, the clock skew (error) is not detected.

Traditionally, a random data pattern is used to test the communication between two components. With a random data pattern, on average, 50% of the data values in the data lines will toggle (i.e., change in bit value from 1 to 0 or from 0 to 1) between two consecutive values. Therefore, there is a 50% chance of not detecting a clock skew problem.

Another prior solution is to use a sequential data pattern to test the communication between two components. With a sequential data pattern, on average, less than 2 bit lines will toggle. For 64 data lines, a sequential data pattern will cause less than 3.13% (($1/2^0+1/2^1+1/2^2+ \ldots +1/2^{63}$)/64) of the lines to change in value.

Therefore, the current technology is limited in its capabilities and suffers from at least the above constraints and deficiencies.

SUMMARY OF EMBODIMENTS OF THE INVENTION

In an embodiment of the invention, an apparatus for generating a maximum change data pattern, includes:

a shift stage configured to shift a generated signal to the right by one bit and to generate a shifted signal;

a logic stage configured to perform an XOR function on the generated signal and the shifted signal, and generate an XOR output signal;

a complement stage configured to complement the XOR output signal, and to generate a complement stage output signal; and a selector configured to select the XOR output signal if the generated signal is even and to select the complement stage output signal if the generated signal is odd.

In another embodiment of the invention, a method for generating a maximum change data pattern, includes:

shifting a generated signal to the right by one bit, in order to generate a shifted signal;

performing an XOR function on the generated signal and the shifted signal, in order to generate an XOR output signal;

complementing the XOR output signal, in order to generate a complement stage output signal; and selecting the XOR output signal if the generated signal is even, and selecting the complement stage output signal if the generated signal is odd.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2 is a table containing a maximum change data pattern, in accordance with an embodiment of the invention.

DETAILED DESCRIPTION OF PREFERRED EMBODIMENTS

Figure 1:
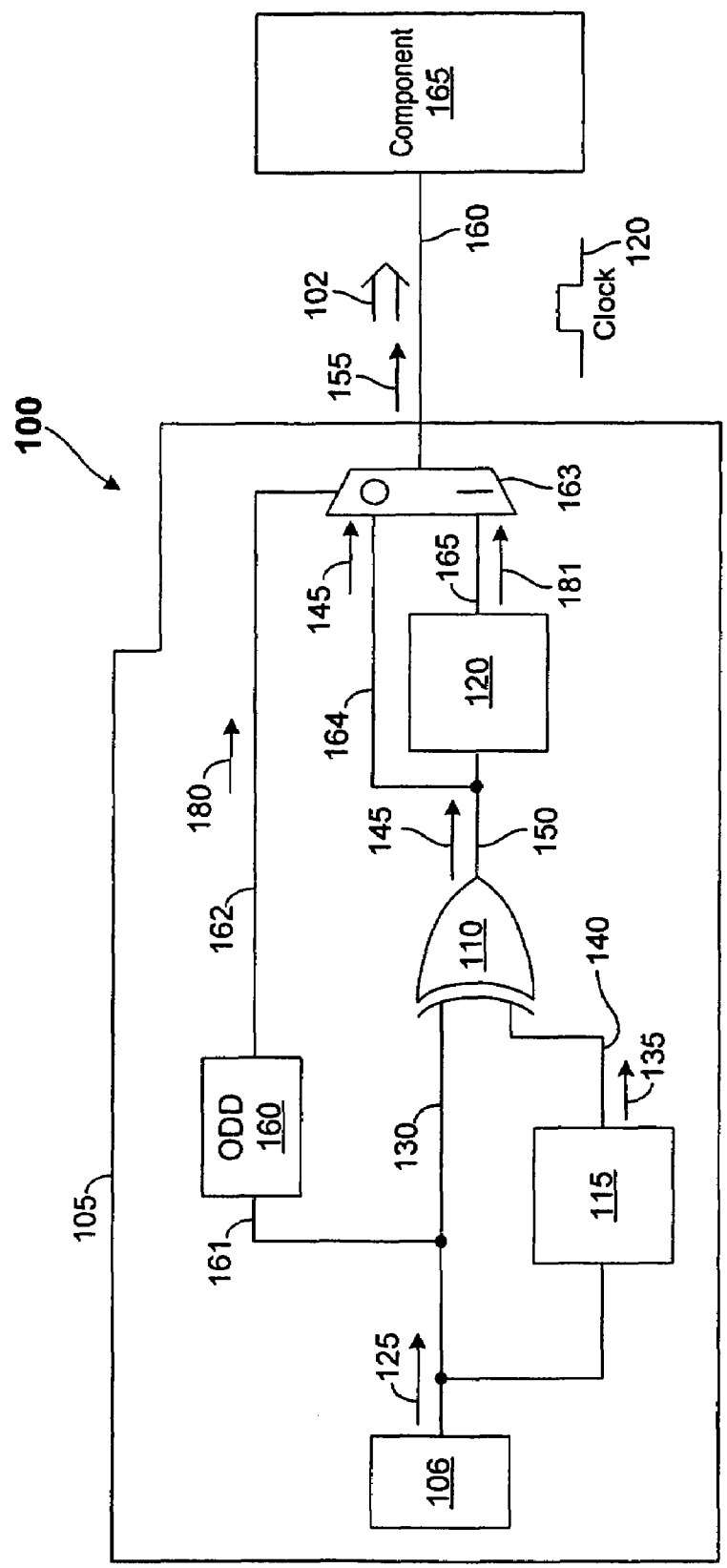
FIG. 1 is a block diagram of an apparatus (system), in accordance with an embodiment of the invention.

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments of the invention.

FIG. 1 is a block diagram of an apparatus (system) 100, in accordance with an embodiment of the invention. The apparatus 100 includes a data generator 105 that generates a maximum change data pattern 102 that improves error detection in testing the communication between components. This data pattern 102 may also be useful when measuring characteristics of components during the testing of the components. In an embodiment, the data generator 105 includes a sequential pattern generator 106, a logic stage 110 which performs the XOR (exclusive OR) function, a shift stage 115, and a complement stage 120 which are discussed below. Typically, the apparatus 100 is implemented in hardware, but an embodiment of the apparatus 100 can also be implemented in software.

The sequential pattern generator 106 generates the generated signals 125, and the pattern formed by the signals 125 may vary in width. The generated signals 125 will typically increase in bit value, sequentially. Some example values of the signals 125 are shown in the table 200 of FIG. 2.

The sequential pattern generator 106 sends the signals 125 on line 130. The shift stage 115 will shift a signal 125 to the right by one bit, in order to generate a shifted signal 135 on line 140.

The logic stage 110 will perform a XOR function on the signals 125 and 135, in order to generate the XOR output signal 145 on line 150.

The complement stage 120 will complement the XOR output signal 145, in order to generate the complement stage output signal 181.

The block 105 also includes an ODD (odd detection block) block 160 and a selector 163. The ODD block 160 is a logic block to determine if its input value is an odd value or even value. The signal 125 is transmitted as an input into ODD block 160. If the signal 125 input into ODD block 160 is odd (least significant bit set), then ODD block 160 will produce a true signal (value "1") as its output control signal 180 via line 162. If the signal 125 input into ODD block 160 is even, then ODD block 160 will produce a false signal (value "0") as its output control signal 180. This true/false output signal 180 from ODD block 160 is routed, via line 162, to a selector 163. This selector 163 takes two values (signal 145 on line 164 and signal 181 on line 165) and routes the selected value as an output signal 155. The value of the control signal 180 will determine if the XOR output signal 145 or the complement signal 181 is selected as the output of the selector 163. If the control signal 180 is 0 (false), then the value from line 164 (i.e., XOR output signal 145) is selected by the selector 163 as an output signal 155. If the control signal 180 is 1 (true), then the value from line 165 (i.e., complement signal 181) is selected by the selector 163 as an output signal 155.

The selector 163 generates data (output signal) 155 which is transmitted across the bus 160 to a component 165 for purposes of testing the component 165.

The multiple data 155 generated by the selector 163 will form a maximum change data pattern 102 that is used for testing the component 165.

A clock signal 170 is used to latch a value in the maximum change data pattern 102, in order to detect communication errors such as clock skew and/or to measure other characteristics during the testing process.

In previous approaches, assuming that the bus 160 is formed by 64-bit parallel paths, on average, 2 ($½^0+½^1+½^2...$) bits change values between each incremented value. Therefore, in previous approaches, there is only a 1/64 chance to catch a clock skew error. However, in the maximum change data pattern 102 provided by the invention, all bits will change in value (except for a single bit), as described below, so that there is a 98.4% (63/64) chance of catching a clock skew error.

FIG. 2 is a table 200 containing an example maximum change data pattern 102 as shown in column (e), in accordance with an embodiment of the invention. The maximum change data pattern significantly improves the detection of a clock with skew.

As known to those skilled in the art, gray code is a sequence in which just a single bit changes between each incremented value. In gray code, the bit value change can occur in any of the bits. In contrast, in the maximum change data pattern 102, a maximum number of bits will transition in value, as shown in column (e).

In the example of table 200, assume that each of the signals 125 is a 4 bit value, as shown in column (b). Note that signal 125 can be other even bit values such as 32 bits or 64 bits. For convenience, the corresponding integer value of each signal 125 is shown in column (a).

Typically, the sequential pattern generator 106 will first generate a signal 125 with a value of "0000" (integer value 0) (see columns (a) and (b) in table 200). If signal 125 is "0000", then signal 135 will be "0000" (column (c)) which is "0000" shifted right by one bit. The XOR of the values of signals 125 and 135 will be "0000" (column (d)). Since signal 125 is "0000" which is even, the ODD block 160 (FIG. 1) will generate a control signal 180 with a value of "0" (false), and the selector 163 will select the XOR output signal 145 as the output 155. In this instance, the XOR output signal 145 is "0000" (column (d)).

In the following sequence value, the sequential pattern generator 106 will generate a signal 125 with a value of "0001" (integer value 1) (see columns (a) and (b)). If signal 125 is "0001", then signal 135 will be "0000" (column (c)) which is "0001" shifted right by one bit. The XOR of the values of signals 125 and 135 will be "0001" (column (d)). Since the "0001" value of signal 125 is odd, the ODD block 160 (FIG. 1) will generate a control signal 180 with a value of "1" (true), and the selector 163 will select the complement signal 181 as the output 155. The complement signal 181 will have a value of "1110" which is the complement of the XOR output 145 of "0001". The signal 155 in column (e) has changed from "0000" to "1110", where all bit values changed from 0 to 1, except for the least significant bit which remained at the 0 value.

In the following sequence value, the sequential pattern generator 106 will generate a signal 125 with a value of "0010" (integer value 2) (see columns (a) and (b)). If signal 125 is "0010", then signal 135 will be "0001" (column (c)) which is "0010" shifted right by one bit. The XOR of the values of signals 125 and 135 will be "0011" (column (d)). Since the "0010" value of signal 125 is even, the ODD block 160 (FIG. 1) will generate a control signal 180 with a value of "0", and the selector 163 will select the XOR output signal 145 as the output 155. The XOR output signal 145 has a value of "0011" in this instance. The signal 155 in column (e) has changed from "1110" to "0011", where all bit values changed except for the $2^{nd}$ least significant bit which remained at the 1 value.

In the following sequence value, the sequential pattern generator 106 will generate a signal 125 with a value of "0011" (integer value 3) (see columns (a) and (b)). If signal 125 is "0011", then signal 135 will be "0001" (column (c)) which is "0011" shifted right by one bit. The XOR of the values of signals 125 and 135 will be "0010" (column (d)). Since the "0011" value of signal 125 is odd, the ODD block 160 (FIG. 1) will generate a control signal 180 with a value of "1", and the selector 163 will select the complement signal 181 as the output 155. The complement signal 181 will have a value of "1101" which is the complement of the XOR output 145 of "0010". The signal 155 in column (e) has changed from "0011" to "1101", where all bit values changed except for the least significant bit which remained at the 1 value.

The above operation is similarly performed for other values of signal 125, as shown in table 200. The ODD block 160 will generate a control signal 180 with a "1" or "0" value to control the selector 163, based on whether the signal 125 is an odd number or an even number.

As shown in table 200, in the maximum change data pattern in column (e), all bits will change in value (i.e., all bits are complemented), except for a single bit, in the next bit in the sequence. These bit changes provide a data pattern with maximum change, so that detection of errors during communication testing is improved.

Other configurations for the components in block 105 are permissible. For example, the ODD block 160 may generate a control signal 180 with a value of "0" if the input signal 125 is odd, and generate a control signal 180 with a value of "1" if the input signal 125 is even. In this alternative embodiment, the output line 150 of the XOR gate 110 will be coupled to the "1" input of the selector 163, and the output line 165 of the complement stage 120 will be coupled to the "0" input of the selector 163.

The code length (permutation length) of the maximum change data pattern is dependent on the width of the sequential pattern generator 106. If the sequential pattern generator width is an even number of bits (i.e., N is an even number), then the permutation length is $2^N$ before the data pattern starts to repeat. Otherwise the permutation length is $(2^N)/2$.

Applicant has determined by experimentation that the permutation in the data pattern will also occur for even values of N equal to or less than 50. Based on the Applicant's experimentation and the discussion and pattern disclosed above, one skilled in the art can realize that N can have a value greater than 50, such as, for example 64.

It is further noted that capacitance in a circuit will attempt to maintain the current state in the component. During state transitions, heat is produced due to this capacitance. The maximum change data pattern 102 permits errors to be detected, since heat in certain parts of the component or circuit are produced as a result of the maximum change in values in the data pattern, as described above.

Reference throughout this specification to "one embodiment", "an embodiment", or "a specific embodiment" means that a particular feature, structure, or characteristic described in connection with the embodiment is included in at least one embodiment of the present invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing disclosure. Further, at least some of the components of an embodiment of the invention may be implemented by using a programmed general purpose digital computer, by using application specific integrated circuits, programmable logic devices, or field programmable gate arrays, or by using a network of interconnected components and circuits.

It will also be appreciated that one or more of the elements depicted in the drawings/figures can also be implemented in a more separated or integrated manner, or even removed or rendered as inoperable in certain cases, as is useful in accordance with a particular application.

It is also within the scope of an embodiment of the present invention to implement a program or code that can be stored in a machine-readable medium to permit a computer to perform any of the methods described above. For example, a program can be used to generate the particular data values in the signal 125.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

It is also noted that the various functions (e.g., XOR function), variables, or other parameters shown in the drawings and discussed in the text have been given particular names for purposes of identification. However, the function names, variable names, or other parameter names are only provided as some possible examples to identify the functions, variables, or other parameters. Other function names, variable names, or parameter names may be used to identify the functions, variables, or parameters shown in the drawings and discussed in the text.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus for generating a maximum change data pattern, the apparatus comprising:
    a shift stage configured to shift a generated signal to the right by one bit and to generate a shifted signal;
    a logic stage configured to perform an XOR function on the generated signal and the shifted signal, and generate an XOR output signal;
    a complement stage configured to complement the XOR output signal, and to generate a complement stage output signal; and
    a selector configured to select the XOR output signal if the generated signal is even and to select the complement stage output signal if the generated signal is odd.

2. The apparatus of claim 1, further comprising:
    a pattern generator configured to generate the generated signal.

3. The apparatus of claim 2, wherein the pattern generator generates a sequence of signals.

4. The apparatus of claim 3, wherein the sequence has a permutation length of $2^N$, wherein N is an even number.

5. The apparatus of claim 3, wherein the sequence has a permutation of length $(2^N)/2$, wherein N is an odd number.

6. The apparatus of claim 1, further comprising:
    an odd detection block configured to determine if the generated signal is odd or even, and to generate a control signal to control a selection of the selector.

7. The apparatus of claim 1, wherein the selector is configured to generate an output signal that is one of the signals in a maximum change data pattern.

8. The apparatus of claim 7, wherein the maximum change data pattern is transmitted to a component.

9. A method for generating a maximum change data pattern, the method comprising:
    shifting a generated signal to the right by one bit, in order to generate a shifted signal;
    performing an XOR function on the generated signal and the shifted signal, in order to generate an XOR output signal;
    complementing the XOR output signal, in order to generate a complement stage output signal; and
    selecting the XOR output signal if the generated signal is even, and selecting the complement stage output signal if the generated signal is odd.

10. The method of claim 9, further comprising:
    generating the generated signal from a pattern generator.

11. The method of claim 10, wherein the pattern generator generates a sequence of signals.

12. The method of claim 11, wherein the sequence has a permutation length of $2^N$, wherein N is an even number.

13. The method of claim 11, wherein the sequence has a permutation length of $(2^N)/2$, wherein N is an odd number.

14. The method of claim 9, further comprising:
    determining if the generated signal is odd or even.

15. The method of claim 9, wherein the selected XOR output signal or the selected complement stage output is one of the signals in a maximum change data pattern.

16. The method of claim 15, further comprising:
    transmitting the maximum change data pattern to a component.

17. An apparatus for generating a maximum change data pattern, the apparatus comprising:
  means for shifting a signal to the right by one bit, in order to generate a shifted signal;
  means for performing an XOR function on the signal and the shifted signal, in order to generate an XOR output signal;
  means for complementing the XOR output signal, in order to generate a complement stage output signal; and
  means for selecting the XOR output signal if the generated signal is even, and for selecting the complement stage output signal if the generated signal is odd.

* * * * *